US011336253B2

(12) United States Patent
Arigong et al.

(10) Patent No.: US 11,336,253 B2
(45) Date of Patent: May 17, 2022

(54) RF POWER AMPLIFIER WITH COMBINED BASEBAND, FUNDAMENTAL AND HARMONIC TUNING NETWORK

(71) Applicant: Cree, Inc., Durham, NC (US)

(72) Inventors: Bayaner Arigong, San Jose, CA (US); Haedong Jang, San Jose, CA (US); Richard Wilson, Morgan Hill, CA (US); Frank Trang, San Jose, CA (US); Qianli Mu, San Jose, CA (US); E J Hashimoto, San Jose, CA (US)

(73) Assignee: Wolfspeed, Inc., Durham, NC (US)

( * ) Notice: Subject to any disclaimer, the term of this patent is extended or adjusted under 35 U.S.C. 154(b) by 23 days.

(21) Appl. No.: 15/823,155

(22) Filed: Nov. 27, 2017

(65) Prior Publication Data

US 2019/0165753 A1    May 30, 2019

(51) Int. Cl.
*H03H 7/40*    (2006.01)
*H04B 1/04*    (2006.01)
(Continued)

(52) U.S. Cl.
CPC ............. *H03H 7/40* (2013.01); *H03F 1/0205* (2013.01); *H03F 1/0222* (2013.01); *H03F 1/565* (2013.01);
(Continued)

(58) Field of Classification Search
CPC ......... H03H 7/40; H03F 1/0222; H03F 1/565; H03F 3/193; H03F 3/245
See application file for complete search history.

(56) References Cited

U.S. PATENT DOCUMENTS 5,177,453 A    1/1993 Russell et al.
6,734,728 B1    5/2004 Leighton et al.
(Continued)

FOREIGN PATENT DOCUMENTS

CN    205945655 U    2/2017
EP    3096353 A1    11/2016
(Continued)

OTHER PUBLICATIONS

Arigong, Bayaner et al., "RF Amplifier with Dual Frequency Response Capacitor", U.S. Appl. No. 15/667,195, filed Aug. 2, 2017, 1-34.
(Continued)

*Primary Examiner* — Samuel S Outten
(74) *Attorney, Agent, or Firm* — Coats & Bennett, PLLC

(57) ABSTRACT

An amplifier circuit includes a first port, a second port, a reference potential port, and an RF amplifier device having a first terminal electrically coupled to the first port, a second terminal electrically coupled to the second port, and a reference potential terminal electrically coupled to the reference potential port. The RF amplifier device amplifies an RF signal across an RF frequency range that includes a fundamental RF frequency. An impedance matching network is electrically coupled to the first terminal and the first port. The impedance matching network includes a baseband termination circuit that presents low impedance in a baseband frequency region, a fundamental frequency matching circuit that presents a complex conjugate of an intrinsic impedance of the RF amplifier device in the RF frequency range, and a second order harmonic termination circuit that presents low impedance at second order harmonics of frequencies in the fundamental RF frequency range.

14 Claims, 3 Drawing Sheets

(51) Int. Cl.

| | | |
|---|---|---|
| *H03H 7/38* | (2006.01) | |
| *H03F 3/195* | (2006.01) | |
| *H03F 1/02* | (2006.01) | |
| *H03F 1/56* | (2006.01) | |
| *H03F 3/193* | (2006.01) | |
| *H03F 3/24* | (2006.01) | |
| *H03H 11/30* | (2006.01) | |
| *H03H 7/01* | (2006.01) | |

(52) U.S. Cl.
CPC ............ *H03F 3/193* (2013.01); *H03F 3/195* (2013.01); *H03F 3/245* (2013.01); *H03H 7/38* (2013.01); *H03H 11/30* (2013.01); *H04B 1/0458* (2013.01); *H01L 2223/6655* (2013.01); *H03F 2200/387* (2013.01); *H03F 2200/391* (2013.01); *H03F 2200/451* (2013.01); *H03H 2007/013* (2013.01)

(56) References Cited

U.S. PATENT DOCUMENTS

| | | | |
|---|---|---|---|
| 6,879,224 | B2 | 4/2005 | Frank |
| 7,489,188 | B2 | 2/2009 | Lee et al. |
| 7,760,027 | B2 | 7/2010 | Murji et al. |
| 7,800,448 | B2 | 9/2010 | Blednov |
| 8,193,857 | B1 | 6/2012 | Wilson |
| 8,253,496 | B2 | 8/2012 | Ichitsubo et al. |
| 8,593,219 | B1 | 11/2013 | Root |
| 8,717,099 | B2 | 5/2014 | Wilson et al. |
| 8,717,102 | B2 | 5/2014 | Wilson et al. |
| 9,419,568 | B2 | 8/2016 | Beltran Lizarraga |
| 9,425,756 | B2 | 8/2016 | Akesson et al. |
| 9,503,025 | B2 | 11/2016 | Cao et al. |
| 9,673,766 | B1 | 6/2017 | Roberts et al. |
| 2005/0242877 | A1 | 11/2005 | Kusunoki et al. |
| 2008/0191801 | A1 | 8/2008 | Kim et al. |
| 2010/0141168 | A1 | 6/2010 | Zhang et al. |
| 2011/0230149 | A1 | 9/2011 | Kuriyama et al. |
| 2013/0187712 | A1* | 7/2013 | Cabanillas ............... H03F 3/19 330/192 |
| 2015/0200631 | A1 | 7/2015 | Outaleb |
| 2015/0243649 | A1 | 8/2015 | Brech et al. |
| 2016/0013758 | A1* | 1/2016 | Cao ............... H03F 1/0222 330/297 |
| 2016/0105153 | A1 | 4/2016 | Chen et al. |
| 2016/0142020 | A1 | 5/2016 | Wang |
| 2016/0173039 | A1* | 6/2016 | Frei ............... H01L 23/66 330/251 |
| 2016/0285421 | A1 | 9/2016 | Matsuzuka et al. |
| 2016/0344353 | A1* | 11/2016 | Watts ............... H03H 7/38 |
| 2017/0117856 | A1* | 4/2017 | Zhu ............... H01L 23/66 |
| 2017/0359032 | A1 | 12/2017 | McLaren |
| 2017/0366148 | A1 | 12/2017 | Jang et al. |
| 2017/0373645 | A1 | 12/2017 | Jang et al. |
| 2018/0138871 | A1* | 5/2018 | Li ............... H03F 1/565 |

FOREIGN PATENT DOCUMENTS

| | | |
|---|---|---|
| WO | 2016057218 A1 | 4/2016 |
| WO | 2016207600 A1 | 12/2016 |

OTHER PUBLICATIONS

Canning, Timothy et al., "Compact Class-F Chip and Wire Matching Topology", Specification of U.S. Appl. No. 15/386,039, filed Dec. 21, 2016, pp. 1-29.

Chen, Kenle et al., "A 3.1-GHz Class-F Power Amplifier With 82% Power-Added-Efficiency", IEEE Microwave and Wireless Components Letters, vol. 23, No. 8, Aug. 2013, 436-438.

Chen, Kenle et al., "Design of Highly Efficient Broadband Class-E Power Amplifier Using Synthesized Low-Pass Matching Networks", Reprinted from IEEE Transactions on Microwave Theory and Techniques, vol. 59, No. 12, Dec. 2012, pp. 1-12.

Doherty, W. H., "A New High Efficiency Power Amplifier for Modulated Waves", Proceedings of the Institute of Radio Engineers, vol. 24, No. 9, Sep. 1936, pp. 1163-1182.

Gao, S et al., "High-efficiency power amplifier design including input harmonic termination", IEEE Microwave and Wireless Components Letters, vol. 16, Issue 2, Feb. 2006, pp. 81-83.

Goel, Saurabh et al., "LC Network for a Power Amplifier with Selectable Impedance", Specification of U.S. Appl. No. 15/078,298, filed Mar. 23, 2016, pp. 1-32.

Gozzie, Cristian et al., "Embedded Harmonic Termination on High Power RF Transistor", Specification of U.S. Appl. No. 15/421,567, filed Feb. 1, 2017, pp. 1-20.

Haedong, Jang et al., "Broadband Harmonic Matching Network", U.S. Appl. No. 15/709,593, filed Sep. 20, 2017, 1-27.

Jundi, A et al., "An 85-W Multi-Octave Push-Pull GaN HEMT Power Amplifier for High-Efficiency Communication Applications at Microwave Frequencies", IEEE Transactions on Microwave Theory and Techniques, vol. 63, Issue 11, Nov. 2015, pp. 3691-3700.

Liu, Yang et al., "Semiconductor Package with Integrated Harmonic Termination Feature", Specification of U.S. Appl. No. 15/610,805, filed Jun. 1, 2017, pp. 1-26.

Mohadeskasaei, Seyed A. et al., "Design of Broadband, High-Efficiency, and High-Linearity GaN HEMT Class-J RF Power Amplifier", Progress in Electromagnetic Research C, vol. 72, 2017, pp. 177-186.

White, P M., "Effect of input harmonic terminations on high efficiency class-B and class-F operation of PHEMT devices", Microwave Symposium Digest, 1998 IEEE MTT-S International, Jun. 1998, pp. 1611-1614.

Wilson, Richard et al., "Enhanced Instantaneous Bandwidth LDMOS RF Power Transistor Using Integrated Passive Devices", 2016 IEEE MTT-S International Microwave Symposium (IMS), May 22-27, 2016, 1-4.

Zhu, Ning et al., "An Integrated RF Match and Baseband Termination Supporting 395 MHz Instantaneous Bandwidth for High Power Amplifier Applications", 2017 IEEE MTT-S International Microwave Symposium (IMS), Jun. 4-9, 2017, 1114-1117.

International Search Report for PCT/US2018/062612 dated Feb. 12, 2019.

\* cited by examiner

RF POWER AMPLIFIER WITH COMBINED BASEBAND, FUNDAMENTAL AND HARMONIC TUNING NETWORK

FIELD OF TECHNOLOGY

The present application relates to RF (radio frequency) amplifiers, in particular impedance matching networks for RF amplifiers.

BACKGROUND

RF power amplifiers are used in a variety of applications such as base stations for wireless communication systems etc. RF power amplifiers are designed to provide linear operation without distortion. The signals amplified by the RF power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 300 MHz or higher.

RF power amplifiers can include a transistor die to amplify the RF signal. Examples of transistor dies that are used in RF applications include MOSFETs (metal-oxide semiconductor field-effect transistor), LDMOS (laterally-diffused metal-oxide semiconductor) devices, and HEMT (high electron mobility transistor) devices. These devices typically have relatively low characteristic impedances (e.g., 2 ohms or less).

Input and output impedance matching networks are used to match the relatively low characteristic impedances of RF transistors for high power devices), to a fixed impedance value (e.g., 50 ohms). In this way, greater efficiency is obtained by load matching. However, input and output impedance matching networks are frequency selective and introduce impedance dispersion versus frequency, which results in band limited power amplifier operations. Thus, an important goal of RF amplifier design of is highly efficient operation over a wide bandwidth.

Efficient amplifier operation can be achieved by properly terminating RF signals in the baseband frequency that is below the fundamental frequency and by properly terminating higher order harmonics of fundamental signal that are above the fundamental frequency range. One way to filter these signals out is to provide tuning circuits at the circuit board level, i.e., outside of the package that includes the RF transistor die. However, circuit board level termination techniques are complex and require the use of valuable space. Moreover, these techniques have limited effectiveness due to parasitic effects that influence the propagation of the signals between the transistor die and the circuit board. Another way to filter these signals out is at the package level, i.e., within the same package that includes the RF transistor die. While this solution advantageously places the tuning circuitry close to the transistor die, it adds complexity to the design. Moreover, perfect tuning is difficult to achieve due to mutual coupling effects between the bond wires connecting to the various components of the tuning network. This issue becomes particularly problematic as the complexity and component count of the tuning network increases.

SUMMARY

An amplifier circuit is disclosed. The amplifier circuit includes a first port, a second port, and a reference potential port. The amplifier circuit additionally includes an RF amplifier device having a first terminal electrically coupled to the first port, a second terminal electrically coupled to the second port, and a reference potential terminal electrically coupled to the reference potential port. The RF amplifier device is configured to amplify an RF signal as between the first and second terminals across an RF frequency range that includes a fundamental RF frequency. The amplifier circuit additionally includes an impedance matching network electrically coupled to the first terminal of the RF amplifier and the first port. The impedance matching network includes a baseband termination circuit having reactive components with electrical parameters that are tailored such that the baseband termination circuit presents low impedance in a baseband frequency region that is below the RF frequency range. The impedance matching network additionally includes a fundamental frequency matching circuit having reactive components with electrical parameters that are tailored such that the fundamental frequency matching circuit presents a complex conjugate of an intrinsic impedance of the RF amplifier device in the RF frequency range. The amplifier circuit additionally includes a second order harmonic termination circuit having reactive components with electrical parameters that are tailored such that the second order harmonic termination circuit presents low impedance at second order harmonics of frequencies in the fundamental RF frequency range.

A packaged RF amplifier is disclosed. The packaged RF amplifier includes a metal flange comprising a first electrically conductive lead, a second electrically conductive lead, and an electrically conductive die pad. The packaged RF amplifier additionally includes an RF transistor mounted on the metal flange and having a first terminal electrically coupled to the first lead, a second terminal electrically coupled to the second lead, and a reference potential terminal electrically coupled to the die pad, the RF amplifier device being configured to amplify an RF signal as between the first and second terminals across an RF frequency range that includes a fundamental RF frequency. The packaged RF amplifier additionally includes an integrated passive device mounted on the metal flange adjacent to the RF transistor and electrically coupled to the first terminal and the first lead. The integrated passive device includes a plurality of reactive components. Parameters of the reactive components are tailored such that the integrated passive device presents low impedance in a baseband frequency region that is below the RF frequency range, presents a complex conjugate of an intrinsic impedance of the RF amplifier device in the RF frequency range, and presents low impedance at second order harmonics of frequencies in the fundamental RF frequency range.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, depicts a packaged amplifier circuit, according to an embodiment.

FIG. 2A depicts the amplifier from a plan-view perspective and FIG. 2B depicts the amplifier from a side view perspective.

FIGS. 3A, 3B and 3C, depicts a modeled impedance matching network, according to an embodiment. FIG. 3A depicts a circuit schematic of the modeled impedance matching network. FIG. 3B depicts a comparison of transmission characteristics for the modeled impedance matching network with and without second order harmonic tuning, according to an embodiment. FIG. 3C depicts a comparison of transmission characteristics for the modeled impedance matching network within and without baseband termination across a frequency range, according to an embodiment.

DETAILED DESCRIPTION

According to embodiments disclosed herein, an amplifier circuit is disclosed. The amplifier circuit includes an RF amplifier device and an impedance matching network electrically coupled to the output terminal of the RF amplifier device. The impedance matching network is configured to simultaneously perform fundamental frequency matching, baseband termination and second order harmonic termination. To this end, the impedance matching network includes a first reactive network that presents a complex conjugate of an intrinsic impedance of the RF amplifier device in the fundamental frequency range, a second reactive network that presents low impedance in the baseband frequency range, and a third reactive network that presents low impedance at higher order harmonics of the fundamental RF frequency.

According to embodiments disclosed herein, the amplifier circuit including the RF amplifier device and the impedance matching network is integrated within a single device package. The RF amplifier device is provided by a transistor die that is mounted on a conductive die pad of the package between the package leads. The impedance matching network is provided by a network of passive components (e.g., capacitors and inductors) that are mounted on the die pad connected between the transistor die and the package leads.

According to one advantageous embodiment of a packaged amplifier device, an IPD (integrated passive device) is used to provide some or all of the passive components for the fundamental frequency matching circuit, the baseband termination circuit and the second order harmonic termination circuit. This design avoids the drawbacks of circuit board level techniques for selective filtering, such as increased area and decreased effectiveness due to the distance from the transistor die. Moreover, this design avoids the drawbacks of package level selective filtering techniques that rely on complex networks of bonding wires and discrete passive components (e.g. chip capacitors), such as cross-coupling. By using the IPD, many bond wires that are susceptible to cross-coupling are eliminated from the device.

Figure 1:
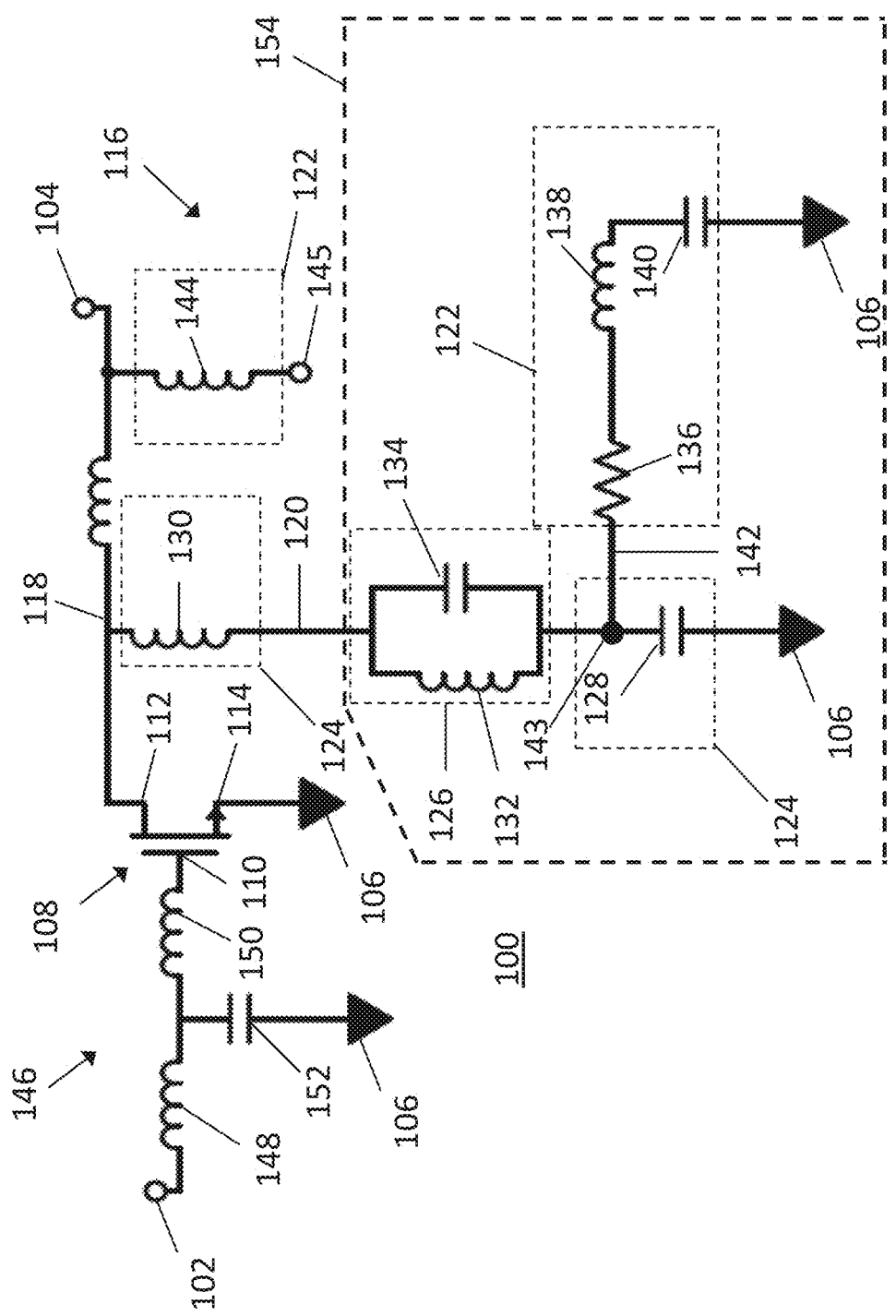
FIG. 1 depicts an electrical schematic of an amplifier circuit, according to an embodiment.

Referring to FIG. 1, an amplifier circuit 100 is depicted. The amplifier circuit 100 includes an input port 102, an output port 104, and a reference potential port 106. The amplifier circuit 100 additionally includes an RF amplifier device 108 having an input terminal 110 electrically coupled to the input port 102, an output terminal 112 electrically coupled to the output port 104, and a reference potential terminal 114 electrically coupled to the reference potential port 106. In various embodiments, the RF amplifier device 108 and the complete amplifier circuit 100 can be a multi-carrier amplifier, a multiband amplifier, an LTE (long term evolution) compliant amplifier, a WCDMA (wideband code division multiple access) compliant amplifier, an 802.11(x) compliant amplifier, etc.

Generally speaking, the RF amplifier device 108 can be any device that can perform amplification for an RF signal. In the depicted embodiment, the RF amplifier device 108 is a transistor device, wherein the input terminal 110 corresponds to a control terminal or gate terminal of the transistor device, the output terminal 112 corresponds to a first load terminal (e.g., the drain terminal) of the transistor device, and the reference potential terminal 114 corresponds to a second load terminal (e.g., the source terminal) of the transistor device.

The RF amplifier device 108 is configured to amplify an RF signal across an RF frequency range as between the input and output terminals 110, 112 across an RF frequency range that includes a fundamental RF frequency. According to an embodiment, this frequency range is a so-called "wideband" frequency range. A "wideband" frequency range refers to the fact that the range of frequency values for the RF signal exceeds the coherence bandwidth of a single channel.

In the following discussion, an RF frequency range between 1.8 GHz (gigahertz) and 2.2 GHz with a fundamental (center) frequency of 2.0 GHz is used for exemplary purposes in describing the parameters of the amplifier circuit 100. In this example, the second order harmonics of the fundamental RF frequency lie in the range of 3.6 GHz to 5.4 GHz, with the second order harmonic of the fundamental frequency being at 4.0 GHz. Moreover, in this example, a baseband signal that modulates the RF signal in the RF frequency range lies in a baseband frequency range that is substantially lower than the RF frequency range, e.g., in a range of 400 MHz (megahertz) in the case of a fundamental frequency range of 1.8 GHz-2.2 GHz. More generally, the principles described herein can be applied to a wide variety of different frequency ranges, including fundamental frequencies in the range of 100 MHz to 10 GHz and baseband frequencies in the range of several MHz to 500 MHz.

The amplifier circuit 100 further includes an output impedance matching network 116 electrically coupled between the output terminal 112 and the output port 104. The output impedance matching network 116 includes a series branch 118 that is connected in series between the output terminal 112 of the RF amplifier and the output port 104 of the RF amplifier and a parallel branch 120 that is in parallel with output port 104 of the RF amplifier and the reference potential terminal 114. The output impedance matching network 116 includes a baseband termination circuit 122, a fundamental frequency matching circuit 124, and a second order harmonic termination circuit 126. The baseband termination circuit 122, the fundamental frequency matching circuit 124, and the second order harmonic termination circuit 126 are each provided by a network of reactive components. In the depicted embodiment, these reactive components include inductors and capacitors. As will be discussed in further detail below, the parameters of these inductors and capacitors (i.e., inductance and capacitance) are specifically tailored to provide a desired frequency response in a given frequency range. More generally, the reactive components of the output impedance matching network 116 can be provided by any of a variety of components (e.g., radial stubs, transmission lines, etc.) wherein the parameters of these components (e.g., radius, length, etc.) are tailored to provide the desired frequency response.

The components of the fundamental frequency matching circuit 124 are tailored such that the output impedance matching network 116 presents at the output terminal 112 of the RF amplifier device 108 a complex conjugate of an intrinsic impedance of the RF amplifier device 108 in the RF frequency range. As is generally known in the art, optimum power transfer occurs when input and output impedances are matched as complex conjugates of one another. Typically, transistor devices such as GaN based HEMTs have relatively low characteristic input and output impedances (e.g., 2 ohms or less). The fundamental frequency matching circuit 124 matches the output impedance of the RF amplifier device 108 to a fixed value (e.g., 50 ohms), which corresponds to a standardized value at the system level. In this way, optimum power transfer between the amplifier circuit 100 and other components at the system level can be achieved. Using the exemplary fundamental frequency range of 1.8 GHz (gigahertz) and 2.2 GHz, the parameters of the reactive components in the fundamental frequency matching circuit 124 (i.e., capacitance and inductance) are tailored so that high power transfer (e.g., no greater than −2 dB (decibels)) occurs across the entire fundamental frequency range of 1.8 GHz (gigahertz) to 2.2 GHz. According to an embodiment, an optimum power transfer of 0 dB or substantially close to 0 dB occurs at the center frequency of 2.0 GHz.

According to an embodiment, the fundamental frequency matching circuit 124 includes a first capacitor 128 and a first inductor 130. The first capacitor 128 and the first inductor 130 are connected in series with one another along the parallel branch 120. The inductance of the first inductor 130 is tailored to provide impedance matching with respect to the characteristic impedance of the RF amplifier device 108. In the depicted circuit, the first inductor 130 is in parallel with the output of the RF amplifier device 108. Therefore, the output capacitance of the RF amplifier device 108 and the first inductor 130 form a first parallel LC resonator. As is generally known in the art, parallel LC circuits provide maximum impedance (from an RF perspective) at a resonant frequency, i.e., the point at which reactive branch currents are equal and opposite. According to an embodiment, the inductance of the first inductor 130 is tailored such that the first parallel LC resonator resonates at the center frequency of 2.0 GHz. The first capacitor 128 is configured as a DC blocking capacitor that blocks very low frequencies (e.g., frequencies of less than 10 MHz) and DC signals. Thus, the DC blocking capacitor has a very large capacitance value. Accordingly, at much higher frequency values including the fundamental frequency range, the first capacitor 128 appears as an RF short at the fundamental frequency. In this way, the effects of the first capacitor 128 on the first parallel LC resonator can be disregarded when tailoring the parameters of the first parallel LC resonator.

The components of the second order harmonic termination circuit 126 are tailored such that the second order harmonic termination circuit 126 presents low impedance at the output terminal 112 of the RF amplifier device 108 in the second order harmonic frequency range. Filtering out higher order harmonic components of the RF signal can substantially improve the efficiency of the device. By mitigating harmonic oscillation at the output of the device, the shapes of the voltage and current waveforms during a transitional state are beneficially controlled for minimal overlap and hence greater efficiency. This is done by including a short circuit path for even higher ordered harmonics (e.g., $2F_0$, $4F_0$, $6F_0$, etc.) of the fundamental frequency $F_0$ of the RF signal being amplified. To this end, the second order harmonic termination circuit 126 is tailored to provide a short circuit path (from an RF perspective) at the second order harmonic of the fundamental frequency, e.g., 4.0 GHz in the exemplary fundamental frequency range. That is, the second order harmonic termination is designed to terminate the RF signals in this frequency range such that they do not appear at the RF output port 104.

According to an embodiment, the second order harmonic termination circuit 126 includes a second inductor 132 and a second capacitor 134. The second inductor 132 and the second capacitor 134 are in parallel with one another along the parallel branch 120 of the impedance matching circuit. Thus, the second inductor 132 and the second capacitor 134 form a second parallel LC resonator. The parameters of the second LC resonator, i.e., the capacitance of the second capacitor 134 and the inductance of the second inductor 132, are tailored to provide a low impedance path for the second order harmonic between the output terminal 112 of the RF amplifier device 108 and the reference potential terminal 114. This tailoring of the parameters of the second LC resonator accounts for the collective effect of the other reactance values in the output impedance matching network 116, including the first parallel LC resonator that includes the first inductor 130 and the intrinsic capacitance of the RF amplifier device 108. As is generally known, a parallel resonant circuit becomes more capacitive as frequency values increase beyond the resonant frequency and becomes more inductive as frequency values decrease below the resonant frequency. Applying this principle, the resonant frequency of the second parallel LC resonator can be tailored such that the second parallel LC resonator is relatively inductive or capacitive at the second order harmonic so as to compensate for other reactive components in the transmission path between the output terminal 112 of the RF amplifier and the reference potential terminal 114, e.g., the first parallel resonator. That is, the parameters of the second parallel LC resonator can be selected such that the output impedance matching network 116 presents an RF short at the output terminal 112 of the RF amplifier at the second order harmonic of the fundamental frequency, e.g., 4.0 GHz.

The baseband termination circuit 122 is tailored to present low impedance in the baseband frequency region that is below the RF frequency range. By suppressing these lower frequency values, the effects of inter-modulation-distortion (IMD) across the baseband frequency range can be mitigated, thereby improving the linear efficiency of the amplifier circuit 100. The parameters of the baseband termination circuit 122 (e.g., capacitance and inductance) are selected such that the impedance matching circuit suppresses these lower frequency values. That is, the baseband termination circuit 122 provides a low impedance path (from an RF perspective) from the output terminal 112 of the RF amplifier device 108 to the reference potential terminal 114 for frequencies that lie in this range.

According to an embodiment, the baseband termination circuit 122 includes a first resistor 136, a third inductor 138, and a third capacitor 140. Each of these components are connected on a second branch 142 of the output impedance matching network 116. The second branch 142 of the output impedance matching network 116 is connected between a first node 143 that directly connects the first capacitor 128 to the second parallel LC resonator and the reference potential port. The parameter values of the components in the baseband termination circuit 122 (i.e., resistance, inductance and capacitance) are selected to present low impedance response across a broadband baseband frequency region. Using a baseband frequency range of 400 MHz as an example, the parameters of the third inductor 138 and the third capacitor 140 can be selected such that these components in conjunction with the other components of the impedance matching circuit form a low impedance path from the output terminal 112 of the RF amplifier device 108 to the reference potential terminal 114. By tailoring the resistance of the first resistor 136, the impedance response of the baseband termination circuit 122 is flattened for better performance across the broadband frequency range. That is, the resistor 136 is used to make the impedance response of the baseband termination circuit 122 less frequency dependent.

Optionally, the output impedance matching network 116 can include a fourth inductor 144 that is connected between the series branch 118 and a DC terminal 145 of the amplifier circuit 100. The fourth inductor 144 is configured as an RF choke, i.e., a device that blocks higher frequency values while transmitting lower frequency values. This RF choke can be used in conjunction with the first resistor 136, the third inductor 138, and the third capacitor 140 to present low impedance in the baseband frequency region.

The amplifier circuit 100 additionally includes an input impedance matching network 146 connected between the input port 102 of the amplifier circuit 100 and the input terminal 110 of the RF amplifier device 108. In the depicted embodiment, the input impedance matching network 146 includes fifth and sixth inductors 148, 150 connected in series between the input port 102 and the input terminal 110 of the RF amplifier device 108, and a fourth capacitor 152 connected in parallel with the input terminal 110 of the RF amplifier device 108 and the reference potential terminal 114. According to one embodiment, the parameters of the sixth inductor 150 and the fourth capacitor 152 are tailored for impedance matching between the input capacitance of the RF amplifier device 108 and a fixed impedance value at the board level (e.g., 50 ohms) in the fundamental frequency range in a similar manner previously discussed.

Instead of the circuit topology depicted in FIG. 1, the input impedance matching network 146 can be configured in a substantially similar manner as the output impedance matching network 116 as previously described. In this case, the series branch 118 of the output impedance matching network 116 connects the input port 102 to the input terminal 110 of the RF amplifier device 108, and the parallel branch 120 is in parallel with the input terminal 110 of the RF amplifier and the reference potential terminal 114. The parameter values of the components in this impedance matching network can be tailored in the same manner as described above while using the input impedance of the amplifier device (e.g., the gate source capacitance in the case of a MOSFET device) as a characteristic impedance that the network is matched to. In different embodiments of an amplifier circuit 100, this impedance matching network topology can be provided only at the input side, only at the output side, or both at the input side and the output side.

Figure 2:
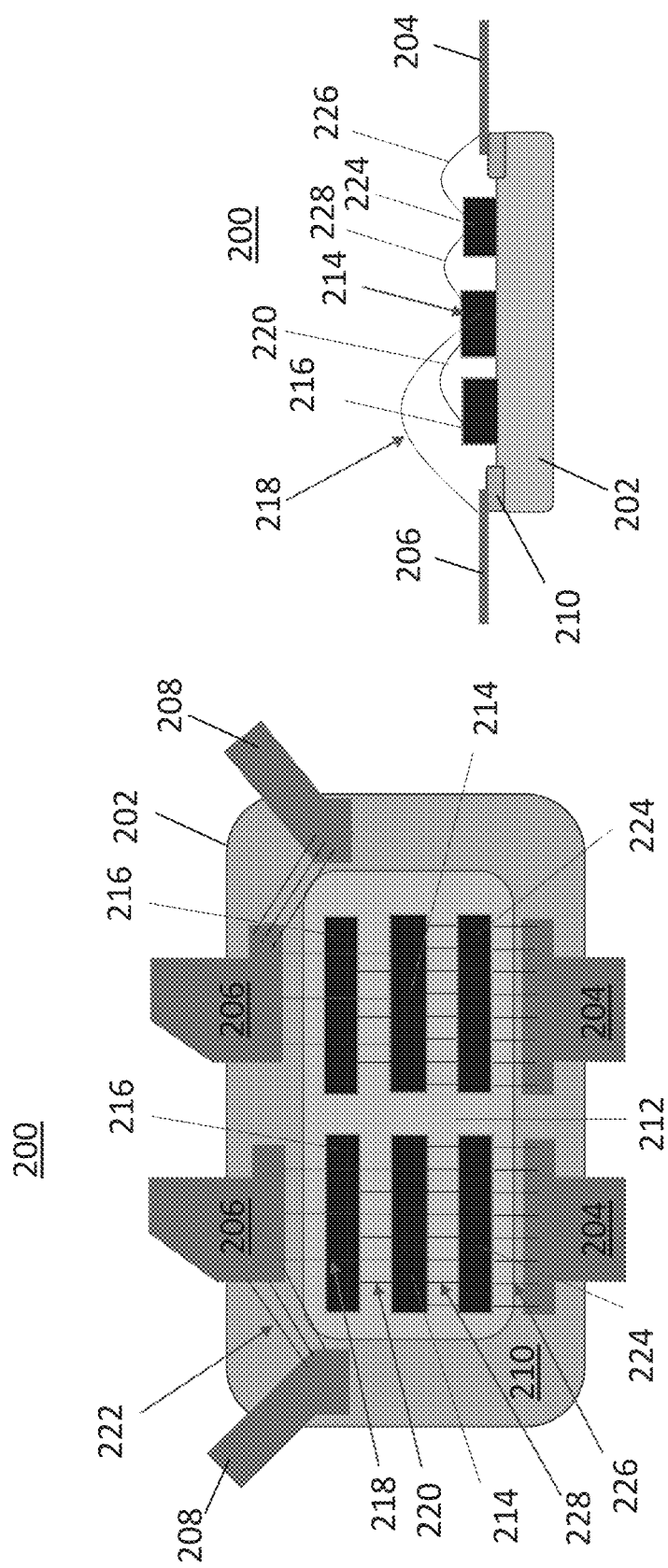
FIG. 2, which includes

Referring to FIG. 2, a packaged RF amplifier 200 is depicted, according to an embodiment. The packaged RF amplifier 200 contains two of the amplifier circuits 100 described with reference to FIG. 1 arranged adjacent to one another. The packaged RF amplifier 200 includes a metal flange 202 that is configured to interface with another device, such as a printed circuit board. A pair of electrically conductive input leads 204 extend away from a first side of the metal flange 202, and a pair of electrically conductive output leads 206 extend away from a second side of the metal flange 202 in an opposite direction as the input leads 204. These electrically conductive input and output leads 204, 206 provide the input and output ports 102, 104, respectively, of the amplifier circuit 100 described with reference to FIG. 1. Optionally, the packaged RF amplifier 200 includes independent DC bias leads 208 extending away from sides of the package adjacent to the output leads 206.

An electrically insulating window frame 210 is formed around the perimeter of the metal flange 202. The window frame 210 insulates the input and output leads 204, 206 from the metal flange 202. A central portion of the metal flange 202 is exposed from the window frame 210. This exposed portion of the metal flange 202 provides an electrically conductive die pad 212 for the mounting of integrated circuit devices thereon. As the metal flange 202 can include a thermally and electrically conductive material (e.g., copper, aluminum, etc.) the electrically conductive die pad 212 can provide both a reference potential connection (e.g., a GND terminal) as well as a heat sink that is configured to carry heat away from the integrated circuit devices mounted thereon.

RF transistors 214 are mounted on the metal flange 202. These RF transistors 214 provide the RF amplifier device 108 as previously described in the amplifier circuit 100 of FIG. 1. The RF transistors 214 can be configured as power transistors such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc., and more generally any type of RF transistor device.

The RF transistors 214 include electrically conductive input, output and reference potential terminals. In the depicted embodiment, the reference potential terminal is disposed on a bottom side of the RF transistors 214. The reference potential terminal directly faces the die pad 212 and is electrically connected to die pad 212, e.g., by a conductive paste. The input and output terminals of the RF transistors 214 are disposed on a top side of the RF transistor 214 that is opposite the reference potential terminal.

The packaged RF amplifier 200 includes the output impedance matching network 116 as previously described with reference to FIG. 1 connected between the output terminals of the RF transistor and the output leads 206. Most of the passive components of the output impedance matching network 116 are provided by an IPD (integrated passive device) 216. The lower side of the IPD 216 includes a reference potential terminal 114 that is mounted on the die pad 212 in a similar manner as previously descried with reference to the RF transistor.

Generally speaking, the term IPD refers to an integrated circuit, which may be semiconductor based, and includes a number of passive devices integrally formed within and connected to the terminals of the IC. A custom circuit topology can be provided by an IPD. A variety of different structures are fabricated within the device to provide the necessary frequency response of a specified passive component (e.g., capacitor, inductor, etc.). Examples of these structures include parallel plate capacitors, radial stubs, transmission lines, etc.

In the depicted embodiment, a first set 218 of electrically conductive bond wires is directly electrically connected between the output terminal of an RF transistor 214 and the output leads 206. A second set 220 of electrically conductive bond wires is directly electrically connected between the output terminal of an RF transistor 214 and the integrated passive device 216. A third set 222 of electrically conductive bond wires is connected directly between the output leads 206 and a DC bias leads 208.

The second set 220 of electrically conductive bond wires provides the first inductor 130 of the output impedance matching network 116 as previously discussed with reference to FIG. 1. Additionally, the third set 222 of electrically conductive bond wires provides the fourth inductor 144 of the output impedance matching network 116 as previously discussed. As those of ordinary skill will appreciate, there is a certain inductance associated with any wire connection. Thus, each span of bond wires extending between two conductive terminals of the packaged RF amplifier 200 provides a defined inductance. This inductance value can be adjusted by tailoring the physical parameters of the spans of the bond wires. Exemplary physical parameters that can be tailored to achieve a desired inductance include height of the bond wires, separation distance between the bond wires, length of the spans of the bond wires, to name a few.

In the depicted embodiment, the remaining components of the output impedance matching network 116 apart from the first inductor 130 are provided by the IPD 216. Specifically, the first, second, and third capacitors 128, 134, 140, the second and third inductors 132, 138, and the first resistor 136 are incorporated into the integrated passive device 216. An outline 154 of the circuit encompassed by the IPD 216 is provided in FIG. 1 to illustrate the interior circuit topology of the IPD 216. This embodiment represents just one example of a variety of potential configurations of the IPD 216. More generally, an IPD may be used to provide any one or more of the passive components in the output impedance matching network 116. A number of separate IPDs can be provided together in a single device package, along with other devices, e.g., chip capacitors, etc.

Referring again to FIG. 2, at the input side of the device, the input impedance matching network 146 as previously described with reference to FIG. 1 is provided. The fourth capacitor 152 is provided by a chip capacitor 224 that is mounted on and electrically connected to the die pad 212 in a similar manner as previously described. A fourth set 226 of bond wires is electrically connected between the input leads 204 and the chip capacitors 224. A fifth set 228 of bond wires is electrically connected between the chip capacitors 224 and the input terminals of the RF transistors 214. The fourth set 226 of bond wires provides the fifth inductor 148 and the fifth set 218 of bond wires provides the sixth inductor 150 in the input impedance matching network 146 as previously described. As previously mentioned, the input impedance matching network 146 can have a similar topology and function as the first output impedance matching network 116. In that case, instead of the chip capacitors 224, an integrated passive device can be mounted at the input side of the device and configured according to the techniques described herein.

Figure 3:
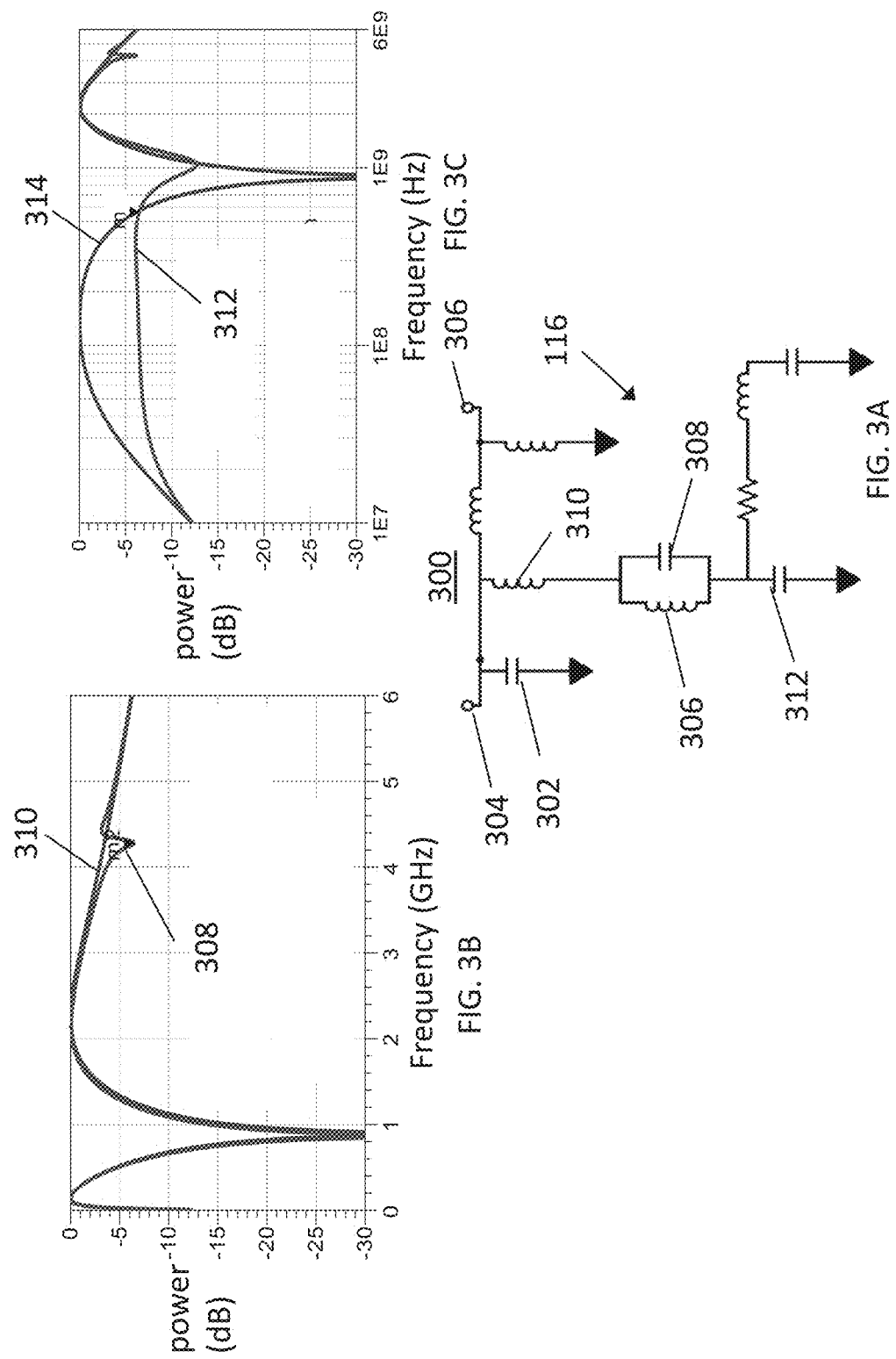
FIG. 3, which includes

Referring to FIG. 3, an illustration of the impedance response of the output impedance matching network 116 across a wide frequency range that includes the baseband region, the fundamental region, and the second order harmonic region is depicted, according to an embodiment is provided.

Referring to FIG. 3A, a circuit schematic of a modelled passive network 300 is depicted, according to an embodiment. The modelled passive network 300 includes the output impedance matching network 116 as previously described with reference to FIG. 1. In addition, the output capacitance of the RF amplifier device 108 is modelled as a fifth capacitor 302 in this network. The modelled passive network 300 includes an input port 304 that corresponds to the output terminal 112 of the RF amplifier device 108 as previously described, and an output port 306 that corresponds to the output port 104 of the amplifier circuit 100 as previously described. Moreover, in this model, the DC terminal 145 is connected to the reference potential terminal 145.

Referring to FIG. 3B, transmission characteristics of the modelled passive network 300 are shown. A first curve 308 plots the transmission characteristics of the modelled passive network 300 of FIG. 3A as between the input and output ports 304, 306. A second curve 310 plots corresponding transmission characteristics as between the input and output ports 304, 306 of a passive network that is identical to that of FIG. 3A, but does not include the second LC resonator, i.e., the second inductor 306 and the second capacitor 308 as illustrated in FIG. 3A. Instead, the first inductor 310 connects directly to the first capacitor 312. In FIG. 3B, the X axis corresponds to a frequency sweep of 10 MHz-6 GHz, which encompasses the baseband, fundamental, and second order harmonic operating regions. The Y axis plots power transfer as between the first inductor 130 and second ports in decibels (dB). Thus, a perfectly transmitted signal corresponds to 0 dB, whereas a signal that is well terminated as between the first and second ports 304, 306 has a lower transmission value, e.g., values below −5 dB (i.e., a power ratio of approximately 31%).

As can be seen, the second order harmonic termination circuit 126 beneficially suppresses a second order harmonic of frequencies in the fundamental frequency range (i.e., frequencies at or close to 4.3 GHz). Meanwhile, the fundamental frequency (i.e., frequencies at or close to 2.15 GHz) is well transferred, as the change in power is at 0 dB. Moreover, the inclusion of the second order harmonic termination circuit 126 does not meaningfully degrade the transfer of signals outside of the second order harmonic frequency range.

Referring to FIG. 3C, transmission characteristics of modelled passive network 300 are shown, according to another embodiment. A third curve 312 plots the transmission characteristics of the modelled passive network 300 of FIG. 3A as between the input and output ports 304, 306. A fourth curve 314 plots corresponding transmission characteristics as between the input and output ports 304, 306 of a passive network that is identical to that of FIG. 3A, but does not include the baseband termination circuit 122. Thus, the second branch 142 and the fourth inductor 144 are removed from the circuit. In the figure, the X axis corresponds to a frequency sweep of 10 MHz-6 GHz, which encompasses the baseband, fundamental, and second order harmonic operating regions. The values are plotted in logarithmic scale so that the baseband operating region is more clearly illustrated. The Y axis plots power transfer as between the first and second ports 304, 306 in decibels (dB). Thus, a perfectly transmitted signal corresponds to 0 dB, whereas a signal that is well terminated as between the first and second ports 304, 306 has a lower transmission value, e.g., values below −5 dB (i.e., a power ratio of approximately 31%).

As can be seen, the baseband termination circuit 122 beneficially suppresses frequency values in the baseband frequency region (i.e., frequencies between 10 Hz and about 560 MHz). Moreover, the impedance response of the baseband termination circuit 122 is relatively flat, meaning that the baseband termination circuit 122 provides frequency independent baseband termination. Meanwhile, the fundamental frequency (i.e., frequencies at or close to 2.15 GHz) is well transferred. Thus, the baseband termination circuit 122 does not degrade the performance of the impedance matching circuit outside of the baseband range.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" describes a permanent low-impedance connection between electrically connected elements, for example a wire connection between the concerned elements. By contrast, the term "electrically coupled" means that one or more intervening element(s) configured to influence the electrical signal in some way (either in the real or imaginary domain) is provided between the electrically coupled elements. These intervening elements include active elements, such as transistors, as well as passive elements, such as inductors, capacitors, diodes, resistors, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An amplifier circuit, comprising:
   an RF amplifier comprising a first terminal, a second terminal, and a reference potential terminal, the RF amplifier configured to amplify an RF signal across an RF frequency range that includes a fundamental RF frequency, wherein the reference potential terminal electrically connects to a reference potential port of the amplifier circuit; and
   an impedance matching network comprising:
      a series branch connected in series between a first port of the amplifier circuit and the first terminal of the RF amplifier; and
      a parallel branch connected in parallel with the first terminal and the reference potential terminal of the RF amplifier, the parallel branch comprising
         a fundamental frequency matching circuit configured to present at the one of the first and second terminals of the RF amplifier device a complex conjugate of an intrinsic impedance of the RF amplifier device in a fundamental frequency range and match the impedance of the RF amplifier device to a predetermined standard impedance value, and comprising reactive components or connectors connected in series between one of the first and second terminals and the reference potential port;
         a baseband termination circuit electrically connected between a node of the fundamental frequency matching circuit and the reference potential port and configured to present a first impedance for signals in a baseband frequency region that is below the RF frequency range to terminate the signals in the baseband frequency region to the reference potential port; and
         a second order harmonic termination circuit electrically connected in series with the fundamental frequency matching circuit and configured to present a second impedance for second order harmonics of RF signals in the fundamental frequency range to terminate the second order harmonics to the reference potential port.

2. The amplifier circuit of claim 1, wherein:
   the fundamental frequency matching circuit comprises a first capacitor and a first inductor connected in series along the parallel branch;
   an inductance of the first inductor is such that the first inductor and an intrinsic capacitance of the RF amplifier form a parallel LC resonator at the fundamental frequency; and
   a capacitance of the first capacitor is such that the first capacitor appears as an RF short at the fundamental frequency.

3. The amplifier circuit of claim 2, wherein the second order harmonic termination circuit comprises a parallel LC resonator connected in series between the first inductor and the first capacitor, the parallel LC resonator comprising a second capacitor connected in parallel with a second inductor, wherein an inductance of the second inductor and a capacitance of the second capacitor are such that the parallel LC resonator together with the first inductor and the intrinsic capacitance of the RF amplifier present the second impedance for the second order harmonic of the frequencies in the RF frequency range to terminate the second order harmonics to the reference potential port.

4. The amplifier circuit of claim 3, wherein the impedance matching network further comprises a second branch connected between the reference potential terminal and a first node, the first node directly connecting the first capacitor to the parallel LC resonator, wherein the baseband termination circuit comprises a third inductor and a third capacitor, the third inductor and the third capacitor connected in series along the second branch, and wherein an inductance of the third inductor and a capacitance of the third capacitor are such that the third inductor and the third capacitor provide the first impedance from the first terminal to the reference potential port for the signals in the baseband frequency region.

5. The amplifier circuit of claim 4, wherein the parallel LC resonator, the first capacitor, the third inductor, and the third capacitor are provided in an integrated passive device.

6. The amplifier circuit of claim 4 wherein the baseband termination circuit further comprises a fourth inductor connected between the first port and the reference potential terminal, said fourth inductor configured as an RF choke for signals in the RF frequency range.

7. The amplifier circuit of claim 1, wherein the first terminal is an output terminal, wherein the second terminal is an input terminal, and wherein the fundamental frequency matching circuit is configured to match an output impedance of the RF amplifier.

8. The amplifier circuit of claim 1, wherein the first terminal is an input terminal, wherein the second terminal is an output terminal, and wherein the fundamental frequency matching circuit is configured to match an input impedance of the RF amplifier.

9. A packaged RF amplifier circuit, comprising:
an electrically conductive interface at least partially surrounded by an insulating material;
an RF transistor mounted on and electrically coupled to the electrically conductive interface and comprising a first terminal, a second terminal, and a reference potential terminal, the RF transistor configured to amplify an RF signal across an RF frequency range that includes a fundamental RF frequency, wherein the reference potential terminal electrically connects to a reference potential port of the RF amplifier; and
an integrated passive device comprising an impedance matching network electrically coupled to the first terminal, and a first set of electrically conductive bond wires directly connected between the first terminal, and a first lead and a second set of electrically conductive bond wires directly connected between the first terminal and the integrated passive device, wherein the second set of electrically conductive bond wires provides a first inductor, and wherein the first inductor and an intrinsic capacitance of the RF transistor form a parallel LC resonator at the fundamental frequency;
wherein the impedance matching network comprises
second order harmonic termination components comprising a parallel LC resonator connected in series between the first inductor and the first capacitor, the parallel LC resonator comprising a second capacitor connected in parallel with a second inductor, wherein an inductance of the second inductor and a capacitance of the second capacitor are such that the parallel LC resonator together with the first inductor and the intrinsic capacitance of the RF amplifier present a first impedance from the first terminal to the reference potential port for second order harmonics of RF signals in the fundamental frequency range to terminate the second order harmonics to the reference potential port;
fundamental frequency matching components separate from the second order harmonic termination components and in series with the second order harmonic termination components and comprising a first capacitor connected in series between the first inductor and an electrically conductive die pad of the electrically conductive interface, wherein a capacitance of the first capacitor is such that the first capacitor appears as an RF short at the fundamental frequency, the fundamental frequency matching components configured to present at the one of the first and second terminals of the RF amplifier device a complex conjugate of an intrinsic impedance of the RF amplifier device in a fundamental frequency range and match the impedance of the RF amplifier device to a predetermined standard impedance value; and
baseband termination components separate from the second order harmonic termination components and fundamental frequency matching components and connected between a node of the fundamental frequency matching circuit and the reference potential port and configured to present a second impedance for signals in a baseband frequency region that is below the RF frequency range to terminate the signals in the baseband frequency region to the reference potential port.

10. The packaged RF amplifier circuit of claim 9 wherein the electrically conductive interface comprises:
a metal flange at least partially surrounded by the insulating material;
a first electrically conductive lead electrically coupled to the first terminal;
a second electrically conductive lead electrically coupled to the second terminal; and
an electrically conductive die pad electrically coupled to the reference potential terminal.

11. The packaged RF amplifier circuit of claim 10 wherein the impedance matching network is mounted to the metal flange adjacent to the RF transistor.

12. The packaged RF amplifier circuit of claim 9, wherein the integrated passive device comprises a first node connecting the first capacitor to the parallel LC resonator and baseband termination components, the baseband termination components comprising a third inductor and a third capacitor, the third inductor and the third capacitor connected in series between the first node and an electrically conductive die pad of the electrically conductive interface, and wherein an inductance of the third inductor is such that the third inductor together with the third capacitor provide the first impedance from the first terminal to the reference potential port for signals in the baseband frequency region.

13. The packaged RF amplifier of circuit claim 9, wherein the first terminal is an output terminal, wherein the second terminal is an input terminal, and wherein the impedance matching network is configured to match an output impedance of the RF transistor.

14. The packaged RF amplifier circuit of claim 9, wherein the first terminal is an input terminal, wherein the second terminal is an output terminal, and wherein the impedance matching network is configured to match an input impedance of the RF transistor.

* * * * *